(12) United States Patent
Li et al.

(10) Patent No.: US 7,385,175 B2
(45) Date of Patent: Jun. 10, 2008

(54) BI-DIRECTIONAL OPTICAL TRANSMISSION SYSTEM AND METHOD

(76) Inventors: Chian Chiu Li, 1847 Bristol Bay CMN, San Jose, CA (US) 95131-3802; Jing Zhang, 35 Tsing-Hua East Road, Hai-Dian District, Beijing (CN) 100083; Wei Wang, 35 Tsing-Hua East Road, Hai-Dian District, Beijing (CN) 100083

( * ) Notice: Subject to any disclaimer, the term of this patent is extended or adjusted under 35 U.S.C. 154(b) by 300 days.

(21) Appl. No.: 11/162,601

(22) Filed: Sep. 16, 2005

(65) Prior Publication Data
US 2006/0060755 A1 Mar. 23, 2006

Related U.S. Application Data

(60) Provisional application No. 60/611,033, filed on Sep. 18, 2004.

(51) Int. Cl.
*G01B 11/02* (2006.01)
(52) U.S. Cl. .................. 250/227.11; 356/497
(58) Field of Classification Search .......... 250/227.11, 250/504; 356/479, 496, 497
See application file for complete search history.

(56) References Cited

U.S. PATENT DOCUMENTS

| | | | |
|---|---|---|---|
| 4,493,113 A | 1/1985 | Forrest et al. | |
| 5,321,501 A * | 6/1994 | Swanson et al. | 356/479 |
| 5,459,570 A * | 10/1995 | Swanson et al. | 356/479 |
| 5,506,445 A | 4/1996 | Rosenberg | |
| 5,742,419 A * | 4/1998 | Dickensheets et al. | 359/201 |
| 5,963,684 A | 10/1999 | Ford et al. | |
| 6,148,016 A | 11/2000 | Hegblom et al. | |
| 6,301,035 B1 | 10/2001 | Schairer | |
| 6,320,686 B1 | 11/2001 | Schairer | |
| 6,392,756 B1 * | 5/2002 | Li et al. | 356/632 |
| 6,552,797 B2 * | 4/2003 | Swanson | 356/479 |
| 6,687,014 B2 * | 2/2004 | Zaidi et al. | 356/504 |
| 6,721,503 B1 | 4/2004 | Jokerst et al. | |
| 6,775,007 B2 * | 8/2004 | Izatt et al. | 356/497 |
| 2004/0160611 A1 * | 8/2004 | Li | 356/521 |
| 2005/0243327 A1 * | 11/2005 | Li | 356/496 |

* cited by examiner

*Primary Examiner*—John R Lee

(57) ABSTRACT

A bi-directional optical transmission system comprises an emitter chip, a detector chip, and an optical fiber. An outgoing beam generated by the emitter chip is coupled into the fiber, which also transmits an incoming beam. The detector and emitter chips are arranged in a side-by-side configuration such that the detector chip receives part of the incoming beam. In one embodiment, a thin-clad edge-emitting laser diode is used to reduce power loss of the incoming beam.

20 Claims, 4 Drawing Sheets

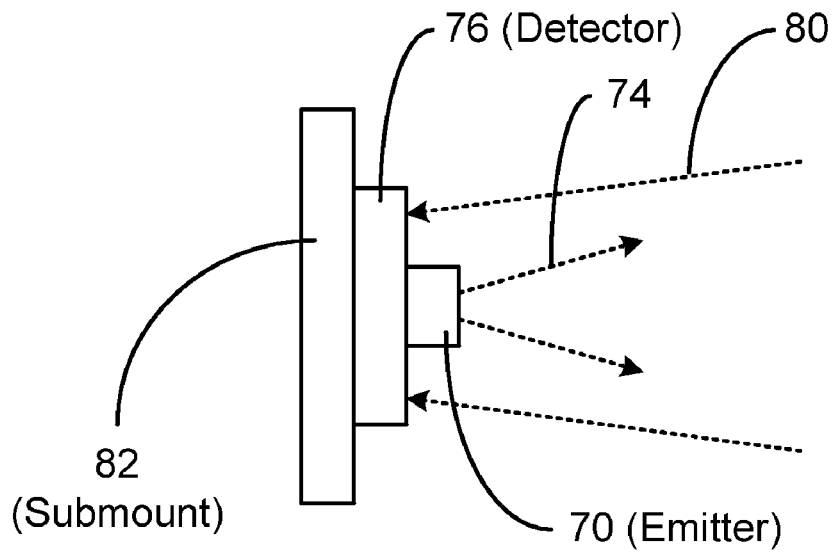
FIG. 1-A (Prior Art)
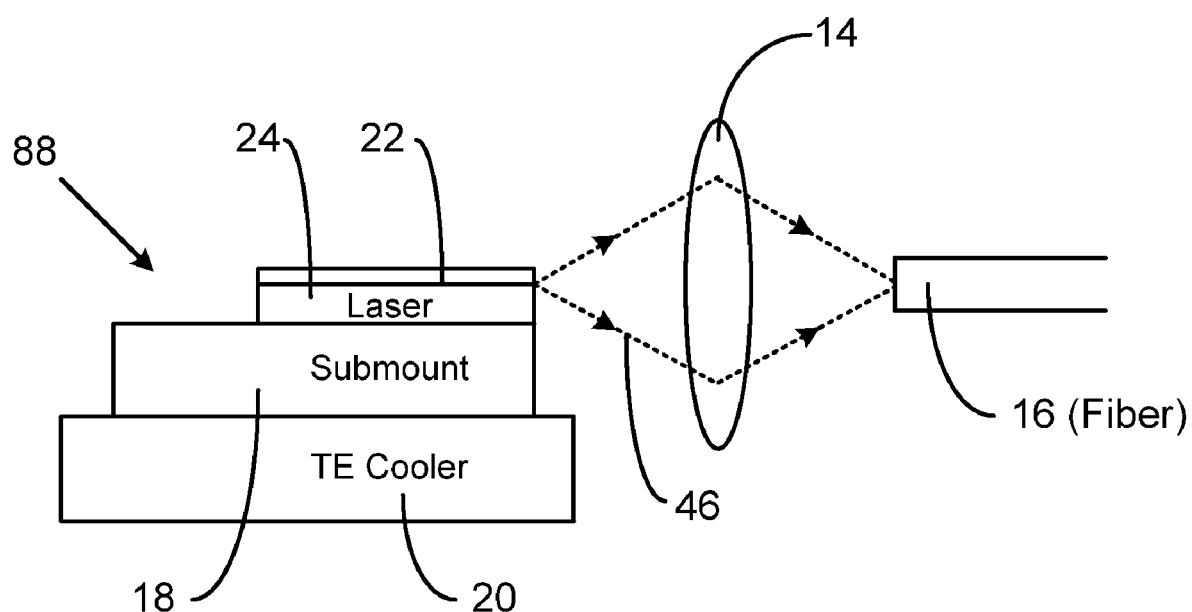
FIG. 1-B (Prior Art)

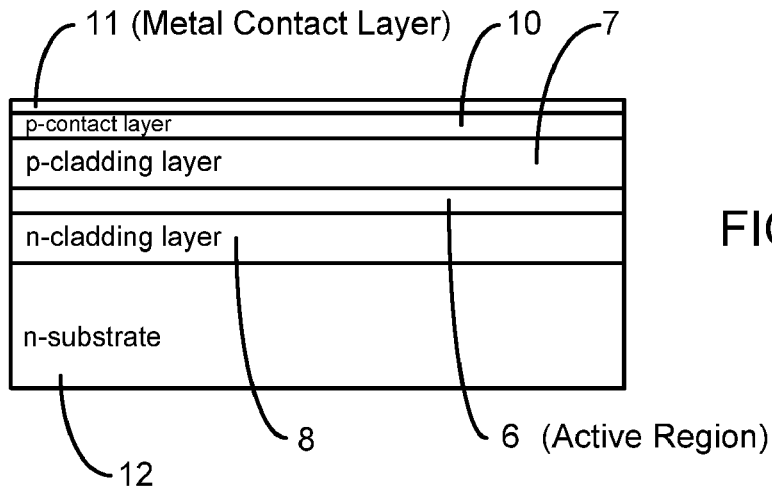
FIG. 1-C (*Prior Art*)
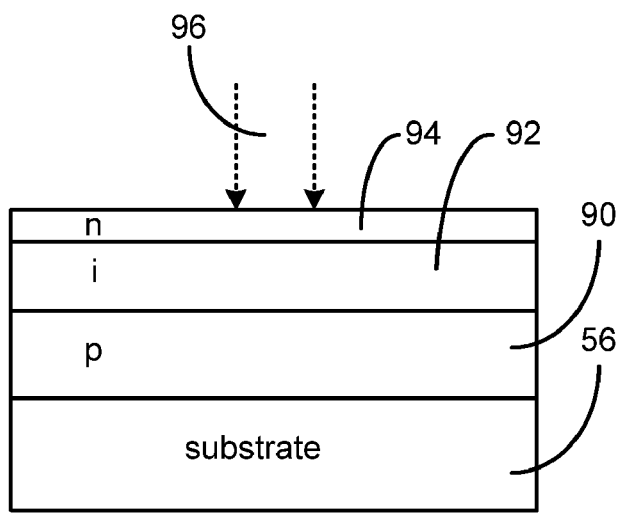
FIG. 1-D (*Prior Art*)
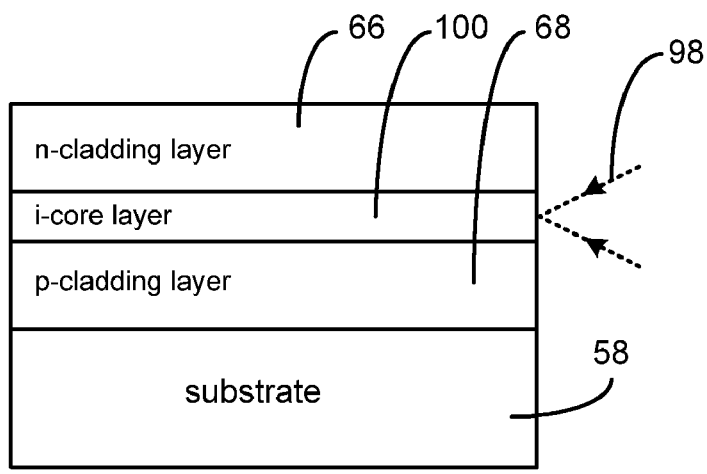
FIG. 1-E (*Prior Art*)

BI-DIRECTIONAL OPTICAL TRANSMISSION SYSTEM AND METHOD

CROSS REFERENCE TO RELATED APPLICATION

This application is entitled to the benefit of U.S. provisional patent application Ser. No. 60/611,033, filed Sep. 18, 2004. This application is also related to U.S. patent application Ser. No. 11/160,948, entitled "Compact Optical Apparatus," now allowed.

FEDERALLY SPONSORED RESEARCH

Not applicable

SEQUENCE LISTING OR PROGRAM

Not applicable

BACKGROUND

1. Field of Invention

This invention relates to optical transmission systems and, more particularly to bi-directional optical transmission systems.

2. Description of Prior Art

To reduce component count and material cost of optical communication systems, a bi-directional transceiver is often used, where incoming and outgoing beams share a single transmission path. Schairer, in U.S. Pat. No. 6,301,035 (2001), and Jokerst et al., in U.S. Pat. No. 6,721,503 (2004), disclosed such a transceiver, which stacks an emitter chip, e.g. a laser or LED chip, on a photo detector chip. Since it doesn't need a beam splitter to create separate optical paths for a light source and detector, the structure is compact and it reduces redundant parts. The scheme works well when an incoming beam has a large beam size and the detector chirp is bigger than the emitter chip, because the latter sits in front of the former.

In many systems however, an emitter chip heats itself up easily due to power consumption. So a thermoelectric (TE) cooler is often needed to control the chip temperature. A TE cooler, a heat conductive submount, and an emitter chip are usually bonded together to form an emitter subassembly, which, in most cases, is much larger than a detector chip. The bulky emitter subassembly makes it impossible to sit atop a detector chip and build a compact transmission system.

Therefore, there exists a need for a bi-directional transmission system which is able to have a relatively large emitter subassembly comprising an emitter, a submount, and a TE cooler.

OBJECTS AND ADVANTAGES

Accordingly, several main objects and advantages of the present invention are:

a) to provide an improved bi-directional transmission system;

b) to provide such a system which is able to accommodate an emitter subassembly comprising an emitter chip, a detector chip, and a TE cooler;

c) to provide such a system which disposes an emitter chip and a detector chip in a side-by-side configuration; and d) to provide such a system which uses a thin-clad edge-emitting laser diode for reducing the power loss of an incoming beam.

Further objects and advantages will become apparent from a consideration of the drawings and ensuing description.

SUMMARY

In a bi-directional transmission system, an emitter chip and a detector chip are placed in proximity and side-by-side. The emitter chip generates an outgoing beam which is coupled into an optical fiber. The detector chip receives an incoming beam that is transmitted through the fiber. In one embodiment, a thin-clad edge-emitting laser diode is used to reduce the power loss due to blocking of the incoming beam by the emitter chip.

ABBREVIATIONS

TE Thermoelectric
VCSEL Vertical Cavity Surface Emitting Laser

BRIEF DESCRIPTION OF THE SEVERAL VIEWS OF THE DRAWINGS

FIG. 1-A is a schematic cross-sectional view of a prior-art bi-dimensional transceiver subassembly.

FIG. 1-B is a schematic cross-sectional view of a prior-art edge-emitting diode laser module having an output optical fiber.

FIG. 1-C is a schematic cross-sectional view of a prior-art edge-emitting laser diode.

FIGS. 1-D and 1-E are schematic cross-sectional views of a prior-art PIN diode and a waveguide PIN diode.

Figure 2:
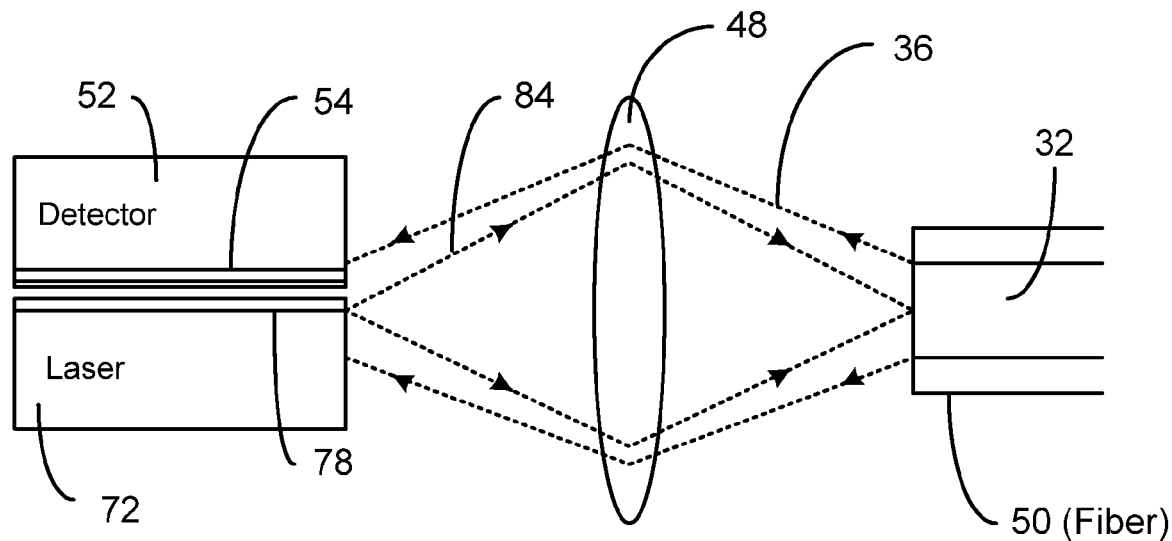
FIGS. 2-5 are schematic cross-sectional views showing embodiments of bi-directional transceiver subassembly where emitter and detector chips are arranged side-by-side.

| REFERENCE NUMERALS IN DRAWINGS | | | |
|---|---|---|---|
| 6 | active region | 7 | p-cladding layer |
| 8 | n-cladding layer | 10 | p-contact layer |
| 11 | metal contact layer | 12 | n-type substrate |
| 14 | lens system | 16 | optical fiber |
| 18 | submount | 20 | TE cooler |
| 22 | active region | 24 | laser diode |
| 26 | sensing area | 28 | detector chip |
| 32 | fiber core | 34 | outgoing beam |
| 36 | incoming beam | 38 | lens system |
| 46 | outgoing beam | 48 | lens system |
| 50 | optical fiber | 52 | PIN diode |
| 54 | core layer | 56 | substrate |
| 58 | substrate | 60 | incoming beam |
| 62 | VCSEL | 66 | n-type layer |
| 68 | p-type layer | 70 | emitter chip |
| 72 | laser diode | 74 | outgoing beam |
| 76 | detector chip | 78 | active region |
| 80 | incoming beam | 82 | submount |
| 84 | outgoing beam | 88 | emitter subassembly |
| 90 | p-type layer | 92 | intrinsic layer |
| 94 | n-type layer | 96 | incoming beam |
| 98 | incoming beam | 100 | intrinsic layer |

DETAILED DESCRIPTION—FIGS. 1-A-1-E—PRIOR-ART

FIG. 1-A shows schematically a prior-art bi-directional optical transceiver subassembly. An emitter chip 70 emits an outgoing beam 74, while a detector chip 76 senses an incoming beam 80. Emitter chip 70 is stacked on the top of detector chip 76 which is bonded onto a submount 82. In such an arrangement, emitter chip 70 has to be small to minimize blocking of incoming beam 80.

FIG. 1-B is schematic cross-sectional view of a prior-art semiconductor diode laser module, where a laser diode 24 emits a beam 46 that is coupled to an optical fiber 16 by a lens system 14 (Supporting and bonding materials are not shown in FIG. 1-B). Diode 24 is of edge-emitting type and contains an active region 22. As in many applications, diode 24, a heat conductive submount 18, and a TE cooler 20 are assembled to make an emitter subassembly 88.

Because a TE cooler tends to be bulky, an emitter subassembly, like subassembly 88, usually is much bigger than a regular detector chip, and can't be used for scheme described in FIG. 1-A.

FIG. 1-C describes a schematic cross-sectional view of a typical prior-art edge-emitting semiconductor laser diode. The diode is fabricated on an n-type substrate 12, which usually is a thin square or rectangular semiconductor chip with a thickness around one hundred microns. Deposited on substrate 12 are an n-type cladding layer 8, an active region 6, a p-type top cladding layer 7, and a p-type contact layer 10. The active region is where the light is generated. The surface of contact layer 10 is the top surface of the diode, above which is a metal contact layer 11 as a top electrode.

In most cases, a diode has a relatively thick top cladding layer in a thick-clad design, where the layers between a top surface and an active region have a total thickness of about two microns. In the case of a thin-clad laser diode, however, the total layer thickness can be reduced to several tenths of one micron.

FIG. 1-D shows schematically a cross-sectional view of a typical PIN diode. The diode comprises a p-type layer 90 on a substrate 56, an intrinsic layer 92, and an n-type layer 94. The top surface of layer 94 faces the direction of an incoming beam 96, which impinges onto the diode and is mostly absorbed by intrinsic layer 92.

FIG. 1-E is a schematic cross-sectional view of a prior-art waveguide PIN diode, which includes an n-type top cladding layer 66, an intrinsic core layer 100, and a p-type bottom cladding layer 68 on a substrate 58. An incoming beam 98 is coupled into the core layer, where the light is transmitted and absorbed. Cladding layers 90 and 94 have a smaller refractive index than core layer 92 in order to guide the light wave.

FIG. 2—An Embodiment which Places a Detector Chip Beside an Emitter Chip

FIG. 2 depicts schematically a cross-sectional view of an embodiment of bi-directional transceiver subassembly according to the invention. The cross section is cut along a direction of light propagation. An edge-emitting laser diode 72 has an active region 78 and emits an outgoing beam 84 which is coupled into a core region 32 of an optical fiber 50, while an incoming beam 36 is transmitted toward laser diode 72 through the fiber. A waveguide PIN diode 52 as a detector chip is placed opposite the top electrode of laser diode 72 in a side-by-side configuration. When incoming beam 36 is focused by a lens system 48, part of the beam impinges onto diode 52 and is coupled into a core layer 54 of the diode. Since diode 52 is on one side of laser diode 72, the latter can be replaced by emitter subassembly 88 of FIG. 1-B, which has a submount and TE cooler on the other side of the laser diode.

In FIG. 2, beam 36 and 84 overlap each other. Since beam 36 has the maximum intensity at its center, core layer 54 should be parallel and close to active region 78 in order to receive more power of the incoming beam. As a result, it is desirable to have a thin top cladding layer of diode 52, thin top electrodes of the diodes, and close proximity between the diodes. Therefore, compared to a thick-clad diode, a thin-clad laser diode blocks less of the incoming beam and is preferred here.

The scheme of FIG. 2 also works in a two-wavelength system. For example, it may involve an outgoing beam at 1330 nm and an incoming beam at 1550 nm. The two-wavelength system reduces the interference inflicted on the emitter laser by the incoming beam.

Figure 3:
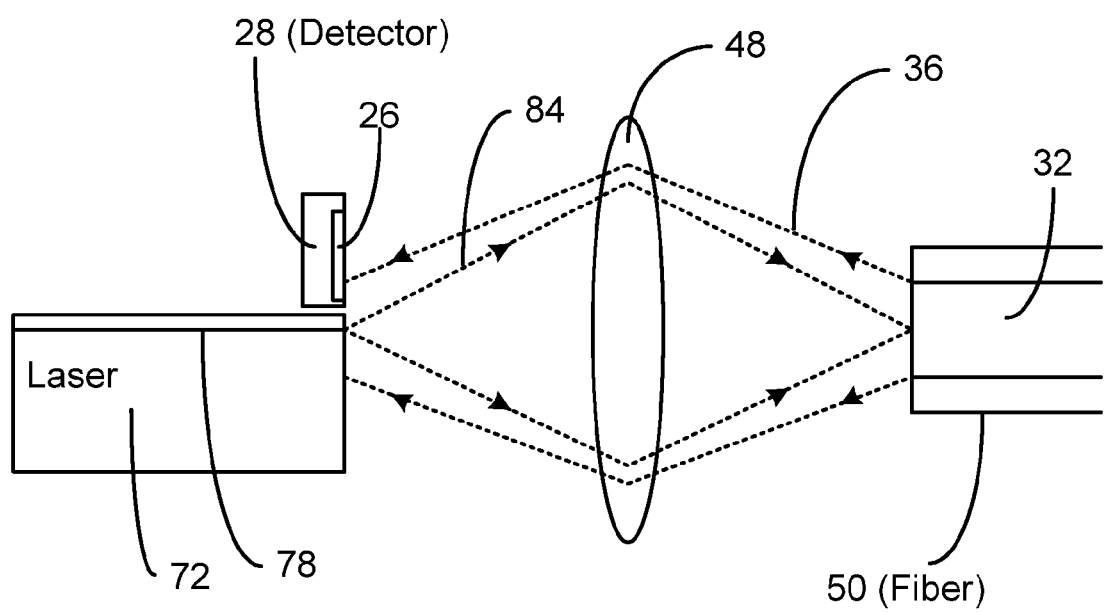
Figure 4:
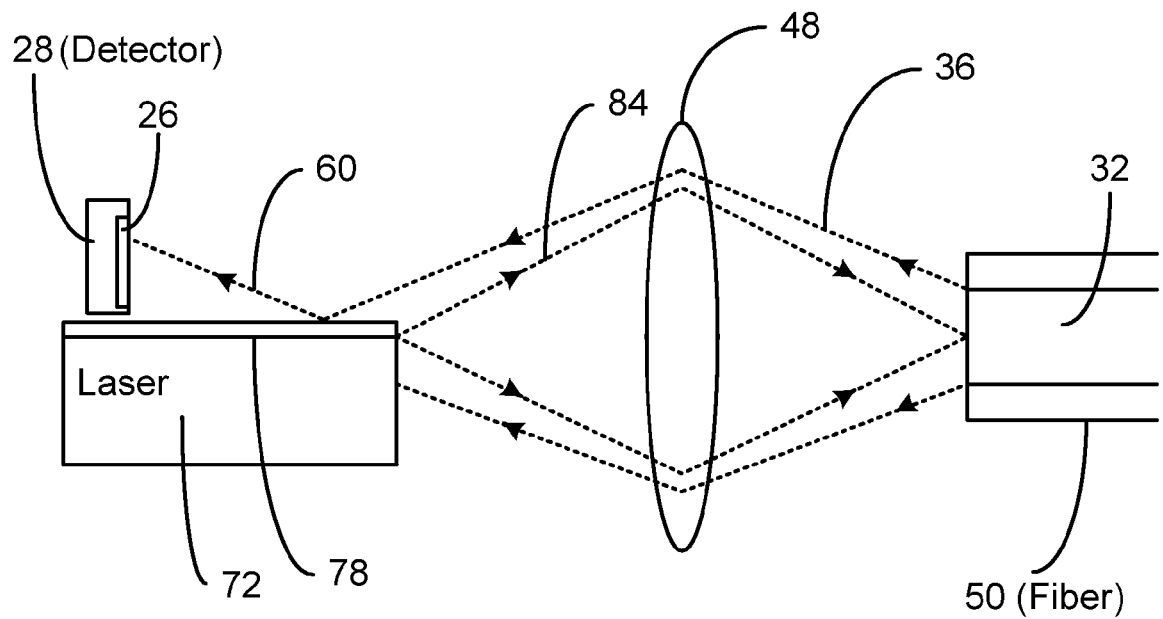
Figure 5:
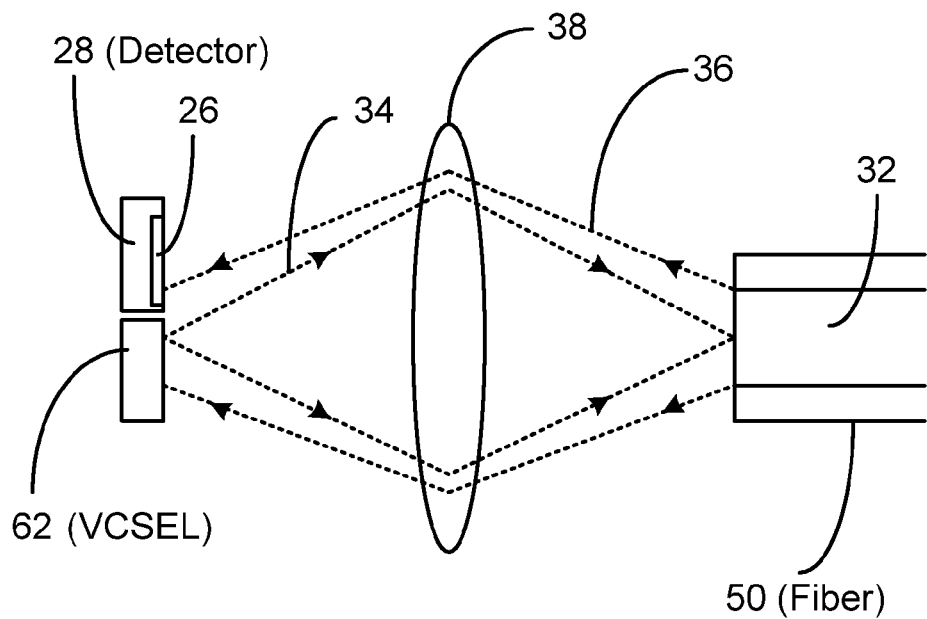

FIGS. 3-5—Embodiments having Side-by-Side Configuration

FIG. 3 shows schematically a cross-sectional view of another embodiment, where a detector 28 has a sensing region 26 which faces incoming beam 36. The setup is similar to that of FIG. 2 except the replacement of the detector chip. The sensing region comprises a PIN diode and has a much larger receiving window than waveguide PIN diode 52.

Since a PIN diode detects light impinging onto its top surface, detector 28 may be disposed in various places, besides being aligned to the front facet of diode 72 as shown in FIG. 3. For example, it may be placed between laser diode 72 and lens 48, as long as it only blocks a tolerable portion of beam 84. Detector 28 may also be placed between the rear and front facets of diode 72 as shown schematically in FIG. 4, where a part of beam 36 becomes a beam 60 after being reflected by the top electrode of the laser diode. Because beam 60 is divergent, its spot size increases when it is further away from the front facet. Detect 28 can even be placed away from the rear facet to receive beam 60, though measure must be taken to prevent light that comes out of the rear facet of the laser diode from entering the detector.

FIG. 5 illustrates schematically another embodiment which employs a vertical cavity surface emitting laser (VCSEL). The scheme is the same as shown in FIGS. 2-4 in that a photo diode and a laser chip are disposed side-by-side. A VCESL 62 replaces edge-emitting laser diode 72 of FIGS. 3 and 4. An outgoing beam 34 is coupled into fiber 50 by a lens system 38, which also couples incoming beam 36 to detector 28. The size of a VCSEL may be reduced by shrinking its surface region directly.

CONCLUSION, RAMIFICATIONS, AND SCOPE

Thus it can be seen that I have used a side-by-side emitter-detector arrangement to provide a transceiver subassembly for a bi-directional optical transmission system.

The transceiver subassembly has the following advantages:

The ability to accommodate an emitter subassembly which comprises an emitter chip, a submount, and a TE cooler.

The ability to increase the power of an incoming beam received by a detector by using a thin-clad laser diode.

Although the description above contains many specificities, these should not be construed as limiting the scope of the invention but as merely providing illustrations of some of the presently preferred embodiments. Numerous modifications, alternations, and variations will be obvious to those skilled in the art.

For example, since a two-wavelength system has an emitter and a detector working at different wavelengths, a component may be added which works at one wavelength only. The component may be a filter placed in front of the detector. It blocks the light having the wavelength of the emitter and thus reduces noise resulted from the back reflection of an outgoing beam which may be caused by a lens or a fiber tip. In cases where it is needed to stabilize a light source, an isolator may be installed. The isolator shall work in the light source's wavelength range, while let an incoming beam pass through.

Here is another example. The fiber can be either single-mode or multi-mode. Multi-mode fiber has a larger core size and generates a larger beam than a single-mode fiber, which lessens the loss of the incoming beam. A fiber tip should have anti-reflection coating and angled fiber facet to reduce back reflection.

Therefore the scope of the invention should be determined by the appended claims and their legal equivalents, rather than by the examples given.

What is claimed is:

1. An optical apparatus for emitting an outgoing beam and detecting an incoming beam comprising:
   1) a light source for generating said outgoing beam;
   2) a coupling means for causing said outgoing beam to travel along a predetermined optical path; and
   3) said optical path being arranged such that said outgoing beam relatively maintains its wavefront when traveling along a portion of it;
   4) said incoming beam being arranged to be transmitted toward said light source along said optical path;
   5) a detector, said detector comprising a sensing element for sensing said incoming beam;
   6) said light source and said detector being disposed such that said light source and said detector are proximate to each other and in a side-by-side configuration;
   7) said light source and said detector being arranged in such proximity that said incoming beam is transmitted to said sensing element by said coupling means.

2. The optical apparatus according to claim 1, further including an optical waveguide, said optical path being arranged to go through said optical waveguide at least partially.

3. The optical apparatus according to claim 1 wherein said coupling means includes a lens system.

4. The optical apparatus according to claim 1 wherein said light source and said detector are integrated monolithically.

5. The optical apparatus according to claim 1 wherein said outgoing and incoming beams are arranged to have different wavelengths.

6. The optical apparatus according to claim 1 wherein said light source includes a vertical cavity surface emitting laser (VCSEL).

7. The optical apparatus according to claim 1 wherein said light source includes a laser diode which is arranged to have a relatively thin top cladding layer for improving said detector's efficiency to receive said incoming beam.

8. The optical apparatus according to claim 1 wherein said detector includes a waveguide structure for receiving and sensing said incoming beam.

9. The optical apparatus according to claim 1, further including a temperature control means for adjusting temperature of said light source.

10. A method for transmitting an outgoing beam and detecting an incoming beam, comprising:
   1) disposing a light source and a detector such that they are proximate to each other and side-by-side;
   2) arranging a coupling mechanism;
   3) causing said light source to emit said outgoing beam;
   4) coupling said outgoing beam to a predetermined optical path by said coupling mechanism;
   5) said optical path being arranged such that said outgoing beam travels with a relatively fixed wavefront along at least a portion of said optical path;
   6) arranging said incoming beam to be transmitted toward said light source along said optical path; and
   7) said light source and said detector being arranged in close proximity such that said incoming beam reaches said detector through said coupling mechanism;
   8) detecting said incoming beam by said detector.

11. The method according to claim 10 wherein said optical path is arranged to go through an optical waveguide.

12. The method according to claim 10 wherein said light source and said detector are integrated monolithically.

13. The method according to claim 10 wherein said outgoing and incoming beams are arranged to have different wavelengths.

14. The method according to claim 10 wherein said light source includes a laser diode which is arranged to have a relatively thin top cladding layer for improving efficiency of said detector to receive said incoming beam.

15. The method according to claim 10 wherein said detector includes a waveguide structure for receiving and sensing said incoming beam.

16. An optical apparatus comprising:
   1) a light source arranged to emit an outgoing beam toward a predetermined direction, said light source including:
      a) a top surface,
      b) a top electrode disposed above said top surface,
      c) a light wave generating substructure disposed below said top surface,
      d) said light wave generating substructure comprising an active region, said light wave generating substructure being arranged such that distance between said active region and said top surface is smaller than two microns and said predetermined direction is arranged to be parallel to said top surface; and
   2) a detector, said detector comprising a sensing region for sensing an incoming beam from said predetermined direction;
   3) said detector and said light source being disposed such that said sensing region is in substantial proximity to said top surface.

17. The optical apparatus according to claim 16 wherein said light source and said detector are disposed in a side-by-side configuration.

18. The optical apparatus according to claim 16 wherein said outgoing and incoming beams are arranged to have different wavelengths.

19. The optical apparatus according to claim 16, further including an optical waveguide for transmitting said outgoing and incoming beams.

20. The optical apparatus according to claim 16 wherein said light source and said detector are integrated monolithically.

* * * * *